(12) United States Patent
Wang et al.

(10) Patent No.: US 8,572,452 B2
(45) Date of Patent: Oct. 29, 2013

(54) BLOCK CODE DECODING METHOD AND DEVICE THEREOF

(75) Inventors: Cheng-Kang Wang, Taichung (TW); Chun-Ming Cho, Hsinchu (TW); Chia Chun Hung, Taipei County (TW)

(73) Assignee: Realtek Semiconductor Corp., Hsinchu (TW)

( * ) Notice: Subject to any disclaimer, the term of this patent is extended or adjusted under 35 U.S.C. 154(b) by 653 days.

(21) Appl. No.: 12/567,558

(22) Filed: Sep. 25, 2009

(65) Prior Publication Data

US 2010/0083074 A1 Apr. 1, 2010

(30) Foreign Application Priority Data

Sep. 30, 2008 (TW) .............................. 97137627 A

(51) Int. Cl.
*H03M 13/00* (2006.01)
(52) U.S. Cl.
USPC .......................................... 714/752; 714/760
(58) Field of Classification Search
None
See application file for complete search history.

(56) References Cited

U.S. PATENT DOCUMENTS

| | | | | |
|---|---|---|---|---|
| 6,381,450 B1 * | 4/2002 | Perets et al. | ............... | 455/343.3 |
| 6,460,160 B1 * | 10/2002 | Classson | ........................ | 714/791 |
| 6,654,926 B1 * | 11/2003 | Raphaeli et al. | .............. | 714/780 |
| 7,054,386 B1 * | 5/2006 | Kosmach et al. | ............. | 375/316 |
| 7,254,165 B2 * | 8/2007 | Xie et al. | ....................... | 375/222 |
| 8,149,925 B2 * | 4/2012 | Goldman et al. | ........ | 375/240.27 |
| 2004/0019842 A1 * | 1/2004 | Argon et al. | ................... | 714/755 |
| 2005/0193314 A1 * | 9/2005 | Lamy et al. | .................... | 714/758 |
| 2006/0090114 A1 * | 4/2006 | Duffy et al. | .................... | 714/746 |

FOREIGN PATENT DOCUMENTS

| CN | 1461529 A | 12/2003 |
|---|---|---|
| CN | 101064162 A | 10/2007 |

OTHER PUBLICATIONS

Pyndiah, R.; Glavieux, A.; Picart, A.; Jacq, S.; , "Near optimum decoding of product codes," Global Telecommunications Conference, 1994. GLOBECOM '94. Communications: The Global Bridge., IEEE , vol., No., pp. 339-343 vol. 1, Nov. 28-Dec. 2, 1994.*
Hirst, S.A.; Honary, B.; Markarian, G.; , "Fast Chase algorithm with an application in turbo decoding," Communications, IEEE Transactions on , vol. 49, No. 10, pp. 1693-1699, Oct. 2001.*
Chase, D.; , "Class of algorithms for decoding block codes with channel measurement information," Information Theory, IEEE Transactions on , vol. 18, No. 1, pp. 170-182, Jan. 1972.*
Arico, G.; Weber, J.H.; , "Limited-trial Chase decoding," Information Theory, IEEE Transactions on , vol. 49, No. 11, pp. 2972-2975, Nov. 2003.*

* cited by examiner

*Primary Examiner* — Steve Nguyen
(74) *Attorney, Agent, or Firm* — McClure, Qualey & Rodack, LLP

(57) ABSTRACT

A block code decoding method and device thereof are provided. The procedure of the bounded distance decoding is simplified and the number of correlation calculating is reduced via a set of pre-established XOR masks. The decoding method includes: picking up the source code part of the received message; executing a XOR calculating for the source code part with the XOR masks, and encoding the results thereof to produce a set of compared codes; executing a correlation calculating for the set of compared codes and the received message; and determining a compared code having the maximum correlation result as the decision.

15 Claims, 1 Drawing Sheet

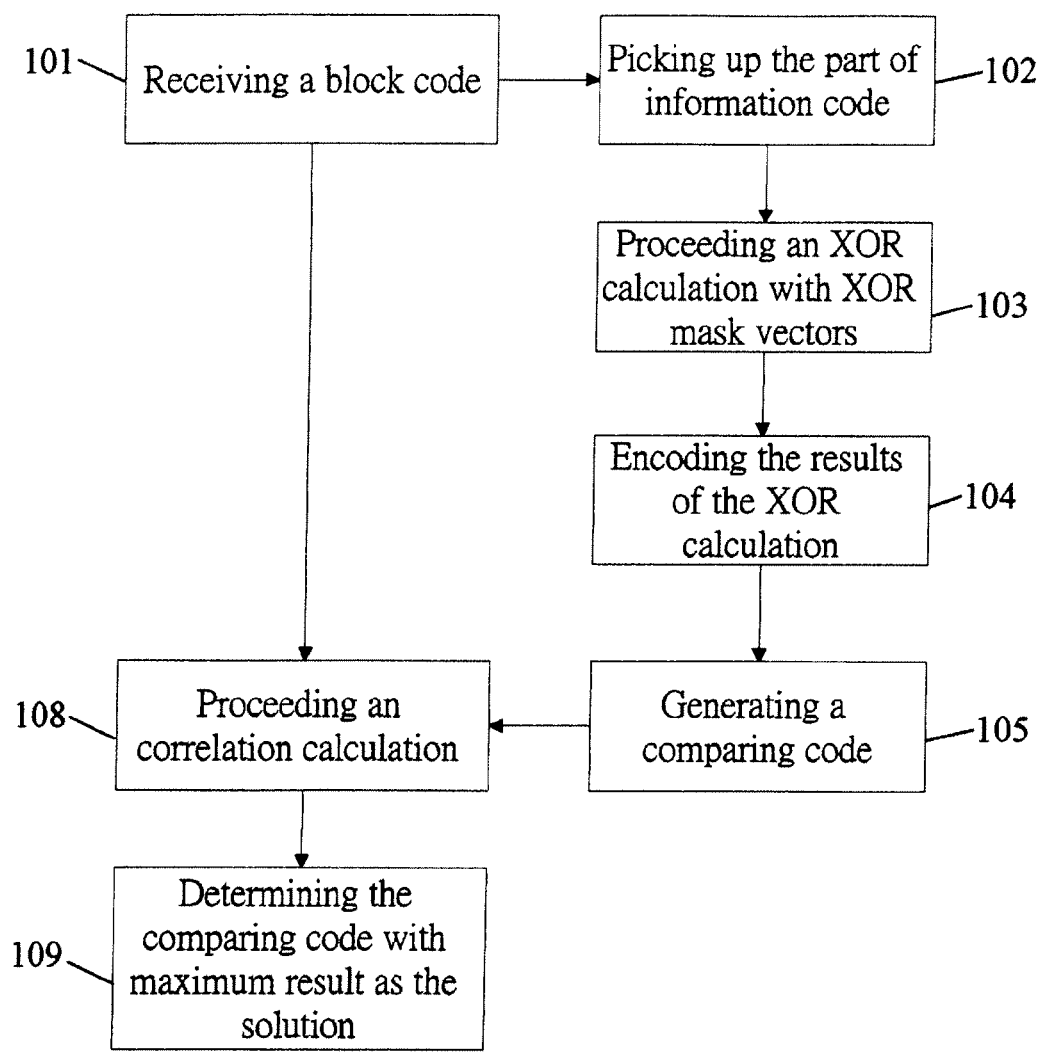

US 8,572,452 B2

BLOCK CODE DECODING METHOD AND DEVICE THEREOF

FIELD OF THE INVENTION

The present invention relates to a device and a method for decoding a block code, and more particularly relates to an uncomplicated device and a method for decoding a block code.

BACKGROUND OF THE INVENTION

In various kinds of transmission and communication system, it is necessary to transmit and receive a large number of data correctly. Particularly, it is an important subject in the wireless communication system or the channel communication system with long distance to receive the digital data reliably and errorlessly. In order to communicate a message or a data, certain channels are adopted to transmit therethrough, however, a digital data usually cannot be received correctly and reliably and an error is occurred because of the defects of the channel hardware, the interference from the external environment, the dissipation of the power, multi route decay, noise, and/or sensitivity of the electronic equipment. Hence, a reliable data transmission is difficult and important.

In order to improve the reliability of the channel data transmission, various methods have been developed, for example, the Forward Error Correction (FEC) code and the corresponding apparatus are adopted for positioning, offsetting, correcting and/or eliminating the errors, wherein many pre-determined codewords are established according to an encoding manual with a specific encoding format for encoding the information data needed to be transmitted. Accordingly, the errors introduced in the transmission process are able to be located and corrected in the decoding procedure via some developed mathematical method.

In the course of the information transmission, the information encoder converts the primitive information to a set of binary codes (bits), which is called as an information sequence u. The broadly-defined "encoding" includes A/D conversion (ADC), source coding and channel encoding etc. The channel encoding technique promotes the reliability of the digital communication by processing an error control of the digital signal, and the quality and quantity of the transmission are promoted. An information sequence is converted to a separated encoded sequence v, which is named as a codeword.

Generally a codeword v is still a sequence of the binary numbers, but sometimes the non-binary numbers is applied in some application. Every codeword can be regarded as a vector in a space having n dimensions, and each bit in the codeword is equal to each component value of the vector. For example, a codeword "101" can be represented by a one-dimensional code vector x=(101)

The number of the components which is different in any two codewords is defined as the Hamming distance $d_H$ of the two codewords, for example, the Hamming distance $d_H(\underline{x}, \underline{y})$ of the two code vector x(101) and y(110) is 2, because the second component and the third component therein are different. As to a well-designed encoding system, the minimum Hamming distance between the effective codewords named as a minimum Hamming distance "$d_{min}$", which is the allowed number of error bits while decoding, namely, an error can be detected when the number of the error bits less than the value of $d_{min}$.

A general decoding method is processed by taking the codewords closest to the received information data by a correlation operation, wherein the correlation operation of two vectors is defined as the multiplying product of the corresponding components therein, for example, the correlation operation (represented by the symbol "⊕") of the vectors x(x1, x2, x3 . . . xn) and y(y1, y2, y3, . . . yn) can be represented as followed:

$$\underline{x}(x_1, x_2, x_3 \ldots x_n) \oplus \underline{y}(y_1, y_2, y_3, \ldots y_n) = x_1{}^*y_1 + x_2{}^*y_2 + x_3{}^*y_3 \ldots x_n{}^*y_n$$

In a binary system, the larger the result of the correlation operation of a received information data and a codeword is, the more the received information data is closing to the codeword, namely, the codeword is more closing to a correct solution of the original data. If the transmitted block code is provided with some specific characteristic, such as linearity or periodicity, the complexity of the decoding process can be largely reduced. However, if the transmitted block code is not provided with any specific characteristics for reducing the complexity of the decoding process, we have to take the correlation operation of the received information block data with all the predetermined codewords to find the codeword with max correlation operation result being the solution code.

As the length of the block code gets longer (i.e. the number of the bits therein goes larger), the amount of the correlation operation goes larger, and thereby the efficiency of the channel decoding is influenced. In order to reduce the amount of the correlation operation and the load of calculation, only the codewords having distance from the received information data in the range of the minimum Hamming distance $d_{min}$ are adopted for correlation operation, which is called a "bounded distance decoding".

However, with the increasing of the amount of information data, and the requirement of fast and accurate transmitting, the efficiency of the prior decoding methods is still dissatisfying. Therefore, a simpler and more efficient decoding method without influencing the reliability of the channel transmission is demanded urgently.

From the above description, in order to overcome the drawbacks in the prior art, a block code decoding method and device thereof are provided by the present invention via the devoting research and perseverant work.

SUMMARY OF THE INVENTION

In accordance with one aspect of the present invention is to solve the technical problems in the prior art.

In accordance with another aspect of the present invention is to provide a block code decoding method and device thereof.

According to a embodiment in the invention, a block code decoding method is provided, the decoding method comprises the steps as follows: (A) systematically encoding a first information code is systematically encoded to generate a first block code comprising the first information code and a first parity check code; (B) transmitting the first block code; (C) receiving the first block code to be a first received block code comprising a first received information code corresponding to the first information code; (D) establishing a plurality of exclusive-or (XOR) mask vectors based on the dimension k of the first information code and a selected Hamming distance of p, wherein the dimension of each of the plurality of XOR mask vectors is k, the plurality of XOR mask vectors are a combination of permuted mask vectors, each of which has k components with 0~p components therein having a value of i and the other components therein having a value of j, and each of the permuted mask vector corresponds to a permutation of the k components; (E) proceeding an XOR calculation with the first received information code and the plurality of XOR mask vectors and obtaining a plurality of second information codes; (F) encoding the plurality of second information codes and obtaining a plurality of second block codes; (G) proceeding a correlation calculation with the first received code and the plurality of second block codes; and (H) taking a specific one of the plurality of second block codes having a maximum correlation calculation result as a solution.

According to a another embodiment in the invention, a plurality of mask vectors are provided for decoding a block code with a limited distance, wherein the block code is generated by systematically encoding an information code and configured with a feature of (n, k, p), a value of n is a dimension of the block code, a value of k is a dimension of the information code, a value of p is a selected Hamming distance for the block code, each of the plurality of mask vectors has a dimension of k and k components having a binary value of one of i and j, and the plurality of mask vectors is a combination of permuted mask vectors, each of which has k components with 0~p components therein having the value of i and the other components therein having the value of j, and each the permuted mask vector corresponds to a permutation of the k components.

According to another embodiment in the invention, a further block code decoding method is provided, the decoding method comprises the steps as follows: (A) receiving a first block code being a first received code; (B) establishing a plurality of XOR mask vectors based on a dimension of k of a first information code and a selected Hamming distance of p, wherein each of the plurality of the XOR mask vectors has a dimension of k, each component of the respective XOR mask vectors comprises a binary value of one of i and j, the plurality of XOR mask vectors is a combination of permuted mask vectors, each of which has k components with 0.about.p components therein having the value of i and the other components therein having the value of j, and each the permuted mask vector corresponds to a permutation of the k components; (C) proceeding an XOR calculation with the first received code and the plurality of the XOR mask vectors and obtaining a plurality of second received codes; (D) proceeding a correlation calculation with the first received code and the plurality of the second received codes; and (E) taking a specific one of plurality of the second received block codes having a maximum correlation calculation value as a most probable solution.

According to a another embodiment in the invention, a further block code decoding method is provided, the decoding method comprises the steps as follows: A decoding method for a received code, comprising an information code and a checking code, the decoding method comprising the steps of: generating x comparing codes based on a total number of erroneous bits and a value of a length of the information code, wherein the x comparing codes are different from each other; proceeding a correlation calculation with the received code and the x comparing codes and obtaining x calculation results; and determining one of the x comparing codes as the most probable solution of the received code based on the x calculation results.

The above objects and advantages of the present invention will become more readily apparently to those ordinarily skilled in the art after reviewing the following detailed descriptions and accompanying drawings, in which:

BRIEF DESCRIPTION OF THE DRAWINGS

FIG. 1 is a schematic flow chart showing the first embodiment of the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Before making a description of an embodiment of the present invention, a description for the block code is presented at first. A function (n, k, t) is usually adopted for representing a characteristic of an block code used in the channel transmitting, wherein the letter "n" is represented for the length (number) of the total bits of the codeword, the letter "k" is represented for the length of the bits of the original code (un-encoded information code), and the letter "t" is represented for the length of the bits which are able to be corrected after the block code is transmitted, wherein the relation between said "t" and the minimum Hamming distance $d_{min}$ can be represented as:

$$t = \left\lfloor \frac{d_{min}-1}{2} \right\rfloor,$$

wherein the symbol "$\lfloor \ \rfloor$" means to a floor function.

Besides, a systematic code can be adopted to be a kind of block code, wherein the encoded systematic block code is composed by the original information code and a check code, for example, a systematic block code is encoded as $v(x_0, \ldots x_{k-1}, z_K, \ldots z_{n-1})$, wherein the sequence $(x_0, \ldots x_{k-1})$ is the original information code and the sequence $(z_K, \ldots z_{n-1})$ is a parity check code. The check code adopted in the following embodiment is taken as a parity check code, which is not intended to be exhaustive or to be limited to the precise form disclosed.

After a block code is transmitted via a channel, a corresponding information code $\underline{y}(y_0, \ldots, y_{k-1}, y_k, \ldots y_{n-1})$ is received in the receiving terminal, and then all the codewords possible being the original block code are respectively adopted to process the correlation calculation with the corresponding information code as the following equation:

$$\arg\max_i \left\{ \sum_{k=0}^{N-1} y_k c_{i,k} \right\},$$

wherein the sequence $\{c_{i,0} \ldots c_{i,k-1} c_{i,k} \ldots c_{i,n-1}\}$ is represented for the i-th codeword, and the relation of the equation $0 \leq i < q^k$ is existed while the $c_{i,k}$ has q bits. Therefore, the more number of bits the codeword has, the more correlation calculation times needed to be processed (since the number of times is $q^k$) is.

In order to reduce the number of times the correlation calculation needed to be processed, only the codewords having the Hamming distance less than number of p from the received information code $\underline{y}(y_0, \ldots y_{k-1}, y_k, \ldots y_{n-1})$ are adopted to process the correlation calculation therewith, i.e. the bounded distance decoding. Accordingly the correlation calculation times needed to be processed is reduced to the value of $(1+C_1^n+C_2^n+\ldots+C_p^n)$, in which the value $1$ ($C_0^n$) is meant to the condition that there is no errors occurring during the channel transmission procedure and the Hamming distance is p, the value $C_1^n$ is meant to the condition that there is only 1 bit is erroneously transmitted during the channel transmission procedure, and the value $C_p^n$ is meant to the condition that there is p bits are erroneously transmitted during the channel transmission procedure.

However, the number of the codewords having the Hamming distance less than value of p is still very large, namely, the larger the number n of the total bits in a codeword is and/or the larger of the adopted Hamming distance p is, the larger the number of the correlation calculations needed to be processed is. In view of this, a method and/or device are provided to solve the problems, which are detailed as following.

The embodiment is well set for the condition where a possible solution of a block code is a systematic code. Please refer to the FIG. 1, which is a schematic flow chart showing the first embodiment of the present invention. In the first embodiment, a first block code $v(x_0, \ldots x_{k-1}, z_k, \ldots z_{n-1}) = v(u,z)$ transmitted from a transmitting terminal is a systematic code, including a first information code $u(x_0, \ldots x_{k-1})$ demanded to be transmitted and a parity check code $z(z_k, \ldots z_{n-1})$ added in the encoding process.

As shown in FIG. 1, the first block code $\overline{v}$ is transmitted via a channel and then received as a first received block code $r(y_0, y_1, \ldots, y_{k-1}, y_k, \ldots y_{n-1}) = \overline{r}_1(y_0, y_1, \ldots, y_{k-1}) + \overline{r}_2(y_k, y_{k+1}, \ldots, y_{n-1})$ (step 101), wherein the component $\overline{r}_1(y_0, y_1, \ldots, y_{k-1})$ is a first received information code corresponding to the first information code $u(x_0, \ldots x_{k-1})$.

Since the first block code $\overline{v}$ is a systematic code, we only need to consider the Hamming distance of the part of information code is less than the value of p, $p \leq d_{min}$, which is the designed Hamming distance of the first block code in the embodiment, so that the first received information code is picked up (step 102) to process a correlation calculation in the next stage.

A set of exclusive-or (XOR) mask vectors M are established based on the number of the bits, which is k, in the first information code (i.e. the dimension of the first information code is k) and a selected Hamming distance of p, wherein the dimension of each of the XOR mask vectors M is k and the set of XOR mask vectors M are the combination of permutated mask vectors, each of which has k components with 0~p components therein having a value of "1" and the other components therein having a value of "0", and each the permutated mask vector corresponds to a permutation of the k components.

The set of exclusive-or (XOR) mask vectors M represents all possible patterns in which the first information code u is transmitted and received, wherein all of the possible patterns includes the patterns where the first information code is correctly and erroneously transmitted in the range of the Hamming distance being less than the value of p. Each the value of "0" in the XOR mask vectors represents a corresponding bit of the transmitted first block code that is correct, and each the value of "1" therein represents a corresponding bit of the transmitted first block code that is erroneous.

For example, while zero bit erroneously transmitted is considered, only a XOR mask vector $M_0\{(0, 0, 0, 0, \ldots, 0)_{k \times 1}\}$ is represented therefor, and all components therein is zero; while only 1 bit erroneously received is considered, the XOR mask vectors are represented as $M_1\{(0, 0, 0, 0, \ldots, 1)_{k \times 1}, (0, 0, 0, 0, \ldots, 1, 0)_{k \times 1}, (0, 0, 0, 0, \ldots, 1, 0, 0)_{k \times 1}, \ldots, (1, 0, 0, \ldots, 0, 0, 0)_{k \times 1}\}$, and the number of the XOR mask vectors of $M_1$ (wherein the index word "$_1$" means only 1 bit erroneously received) is represented by the equation: $C_1^k = k$; while 2 bits erroneously transmitted is considered, the XOR mask vectors are represented as $M_2\{(0, 0, 0, \ldots 0, 1, 1)_{k \times 1}, (0, 0, 0, \ldots, 1, 0, 1)_{k \times 1}, (0, 0, 0, \ldots, 1, 0, 0, 1)_{k \times 1}, \ldots (0, 0, 0, \ldots 0, 1, 1, 0)_{k \times 1}, (0, 0, \ldots, 1, 0, 1, 0)_{k \times 1}, (1, 1, 0, \ldots 0, 0, 0)_{k \times 1}\}$, and the number of the XOR mask vectors of $M_2$ is represented by the equation: $C_2^k$; similarly, while p bits erroneously transmitted is considered, the number of the XOR mask vectors of $M_p$, is represented by the equation: $C_p^k$. All the set of XOR mask vectors $M = \{M_0\ M_1\ M_2 \ldots M_p\}$ are the combination of transmitting patterns with permutated 0~p bits in the first information code u are erroneously received. The number of the total XOR mask vectors is represented by the equation: $(1+C_1^k+C_2^k+\ldots+C_p^k)$.

Next, processing the exclusive-or (XOR) calculation with the first received information code $r_1(y_0, y_1, \ldots, y_{k-1})$ and all the set of XOR mask vectors M (Step 103). The XOR calculation is a binary exchanging calculation, which binary exchanges components of the first received information code $r_1$ corresponding to components having the value of "1" in each the permutated mask vector, and keeping the components of the first received information code corresponding to components having the value of "0" in each the permutated mask vector unchanged. The binary exchanging calculation therein is exchanging "0" and "1" by "1" and "0", if AWGN channel, should take sign of $y_0 \sim y_{k-1}$ first.

Next, a set of second information codes $r_1'$ ($x_0', x_1', \ldots x_{k-1}'$) are obtained, which are the combination of all possible solutions for the first information code based on the Hamming distance p from the first received information code. The number of the second information codes $r_1'$ is the same as the number of the XOR mask vectors, i.e. $1+C_1^k+C_2^k+\ldots+C_p^k$.

Thereafter, all of the set of the second information code are encoded again (step 104), and a set of comparing codes $v'(x_0', x_1', \ldots x_{k-1}', z_0', z_1', \ldots z_{k-1}')$ are obtained therefrom (step 105), which are the combination of all possible solutions for the first block code. The set of comparing codes v' are also called a set of second block codes, and the number thereof can also be represented by the equation: $1+C_1^k+C_2^k+\ldots+C_p^k$. Thereafter, Proceeding a correlation calculation with each of the set of second block codes and the first received block code $r(y_0, y_1, \ldots, y_{k-1}, y_k, \ldots y_{n-1})$ (step 108), and determining a second block code corresponding to the maximum result of the correlation calculation to be a most probably solution of the first block code (step 109). The solution of the original first information code is then obtained therefrom.

In the above proceeding, only k-dimensional XOR mask vectors are established based on the part of information code in the n-dimensional systematic block code (k<n), and the correlation calculations are proceeded with only $(1+C_1^k+C_2^k+\ldots+C_p^k)$ times, and thus the required amount of calculations are effectively reduced in the present invention, since the correlation calculations of $(1+C_1^n+C_2^n+\ldots+C_p^n)$ times are required in the prior art.

Assuming the number p of erroneous bits in the first received block code $r_1(y_0, y_1, \ldots, y_{k-1})$ is not larger than the value k of the dimension of the first information code, i.e. $0 \leq p \leq k$. As the p gets smaller, the number of the correlation calculation times needed to be proceeded decreases. For example, as to a systematic binary block code characterized by (16,8,2), the total correlation calculation times originally therewith is equal to $2^8 = 256$. If the Hamming distance of the encoding system is 2 (i.e. considering 2 bits at most are possibly erroneously transmitted), the times of the correlation calculation required to be proceeded is 37 (i.e. $=1+C_1^8+C_2^8$). If the Hamming distance of the encoding system is 3, the times of the correlation calculation required to be proceeded is 93 (i.e. $=1+C_1^8+C_2^8+C_3^8$), and if the Hamming distance of the encoding system is 4, the times of the correlation calculation required to be proceeded is 163 (i.e. $=1+C_1^8+C_2^8+C_3^8+C_4^8$).

Taking an example for a systematic binary block code characterized by (16 8 2) with the minimum Hamming distance equal to 2, in which a first information code $u(x_0, x_1, \ldots x_7)$ is the original message demanded to transmitted via a channel. The first information code u is systematically encoded as a first block code $v(u,z)=v(x_0, x_1, \ldots x_7, z_0, z_1, \ldots z_7)$, wherein the added component $z(z_0, z_1, \ldots z_7)$ in the encoding process is a parity check code. The first block code v is transmitted via a channel, and then received to be a first received block code $r(y_0, y_1, \ldots y_{15})$. Since the disturbances or noises occurring in the transmitting process, some component bits in the first received block code r might be different from those corresponding in the first block code v. In order to find the approaching solution to the original first information code u, the steps are developed as follows:

At first, proceeding an exclusive-or (XOR) calculation with the part sequence $r_1(y_0, y_1 \ldots y_7)$ (named as a first received information code) in the first received block code r and the 37 pre-developed mask vectors $M_j$. The first received information code $r_1(y_0, y_1 \ldots y_7)$ in the first received block code r is corresponding to the first information code u in the first block code v. The 37 pre-developed mask vectors $M_j$ is represented for the combination of the patterns with 0~2 bits erroneously transmitted therein, which can be shown as: $M_j=\{M_0,M_1,M_2\}$, wherein the value of "0" in each the XOR mask vector is represented for the corresponding bit is transmitted correctly, while the value of "1" is represented for the corresponding bit is received erroneously, and while no bit is erroneously received, $M_0=m_{0,1}(0,0,0,0,0,0,0,0)$;

and while only one bit is erroneously transmitted, $M_1=\{m_{1,1}(0,0,0,0,0,0,0,1), m_{1,2}(0,0,0,0,0,0,1,0), m_{1,3}(0,0,0,0,0,1,0,0), m_{1,4}(0,0,0,0,1,0,0,0), m_{1,5}(0,0,0,1,0,0,0,0), m_{1,6}(0,0,1,0,0,0,0,0), m_{1,7}(0,1,0,0,0,0,0,0), m_{1,8}(1,0,0,0,0,0,0,0)\}$, which is the combination of 8 erroneous pattern vectors;

and while two bits are erroneously transmitted, $M_2=\{m_{2,1}(0,0,0,0,0,0,1,1), m_{2,2}(0,0,0,0,0,1,0,1), m_{2,3}(0,0,0,0,1,0,0,1), m_{2,4}(0,0,0,1,0,0,0,1), m_{2,5}(0,0,1,0,0,0,0,1), m_{2,6}(0,1,0,0,0,0,0,1), m_{2,7}(1,0,0,0,0,0,0,1), m_{2,8}(0,0,0,0,0,1,1,0), m_{2,9}(0,0,0,0,1,0,1,0), m_{2,10}(0,0,0,1,0,0,1,0), m_{2,11}(0,0,1,0,0,0,1,0), m_{2,12}(0,1,0,0,0,0,1,0), m_{2,13}(1,0,0,0,0,0,1,0), m_{2,14}(0,0,0,0,1,1,0,0), m_{2,15}(0,0,0,1,0,1,0,0), m_{2,16}(0,0,1,0,0,1,0,0), m_{2,17}(0,1,0,0,0,1,0,0), m_{2,18}(1,0,0,0,0,1,0,0), m_{2,19}(0,0,0,1,1,0,0,0), m_{2,20}(0,0,1,0,1,0,0,0), m_{2,21}(0,1,0,0,1,0,0,0), m_{2,22}(1,0,0,0,1,0,0,0), m_{2,23}(0,0,1,1,0,0,0,0), m_{2,24}(0,1,0,1,0,0,0,0), m_{2,25}(1,0,0,1,0,0,0,0), m_{2,26}(0,1,1,0,0,0,0,0), m_{2,27}(1,0,1,0,0,0,0,0), m_{2,28}(1,1,0,0,0,0,0,0)\}$, which is the combination of 28 erroneous pattern vectors.

The XOR calculation is a binary exchanging calculation, which binary exchanges components in the first received information code $r_1$ corresponding to components having the value of "1" in each the permutated mask vector, i.e. exchanging "0" by "1", and exchanging "1" by "0", and keeps the components of the first received information code $r_1$ corresponding to components having the value of "0" in each the permutated mask vector unchanged. For example, if the first received block code $r(y_0, y_1, \ldots y_{15})=(0,0,1,1,0,0,1,1,0,0,1,1,0,0,1,1)$, wherein the first received information code $r_1(y_0, y_1 \ldots y_7)=(0,0,1,1,0,0,1,1)$. If we proceed a XOR calculation with said $r_1(y_0, y_1 \ldots y_7)=(0,0,1,1,0,0,1,1)$ and the XOR mask vector $m_{2,2}(0,0,0,0,0,1,0,1)$, the components in $r_1$ corresponding to the components "1" in the $m_{2,2}$ are binary exchanged by replacing "0" and "1" by "1" and "0", and the components in $r_1$ corresponding to the components "0" in the $m_{2,2}$ are unchanged, and thus the result of the XOR calculation above mentioned can be represented by:

$(0,0,1,1,0,0,1,1) XOR (0,0,1,1,0,1,1,0)=(0,0,1,1,0,1,1,0)$

Then the result of the XOR calculation is taken as a second information code $x'(x_0', x_1', \ldots x_7')$, and the second information codes x' is encoded again to generate a second block code $v'(x_0', x_1', \ldots x_7', z_0', z_1', \ldots z_7')$. The number of the total second block code v' is 37, which are all possible solutions of the first block code. In the next, proceeding a correlation calculation with the respective 37 second block code v' and the first received block code $r(y_0, y_1, \ldots y_{15})$, and take the specific one the 37 second block codes having a maximum correlation calculation result as the most possible solution.

However, according to the prior bounded distance decoding method, in order to find the most approaching solution, the first received block code $r(y_0, y_1, \ldots y_{15})$ is required to proceed the correlation calculations with all the erroneous types of the first block code $v(u,z)=v(x_0, x_1, \ldots x_7, z_0, z_1, \ldots z_7)$ having 0~2 error bits therein, and the correlation calculation times therefor is 137 totally ($C_0^{16}+C_1^{16}+C_2^{16}=1+16+120=137$). While only 37 times are required in the method in the embodiment of the present invention, which is evidently and positively beneficial and effective.

In sum, the procedure and calculation for determining the possible solution in the decoding process are effectively simplified and reduced by pre-developing a set of XOR mask vectors based on the minimum Hamming distance. As to a systematic block code, it is only required to proceed the minimum Hamming distance resolution by using by using the XOR masks and ingenious arrangement, hence the times and amount of correlation calculation are largely reduced and the efficiency of the channel transmission is greatly promoted.

Further, the efficacy and the progression of the decoding method of the present invention are surely obtained, while the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar process and steps.

What is claimed is:

1. A block code decoding method, comprising the steps of:
(A) systematically encoding a first information code to generate a first block code comprising the first information code and a first parity check code;
(B) transmitting the first block code;
(C) receiving the first block code to be a first received block code comprising a first received information code corresponding to the first information code;
(D) establishing a plurality of exclusive-or (XOR) mask vectors based on the dimension k being the length of the first information code and a selected Hamming distance of p, wherein the dimension of each of the plurality of XOR mask vectors is k, the plurality of XOR mask vectors are a combination of permuted mask vectors each having k components, wherein between 0 and p components in each mask vector have a value of i and a remaining components therein having a value of j, wherein each of i and j are binary values, each of the permuted mask vector corresponds to a permutation of the k components, and wherein the plurality of XOR mask vectors corresponds to all possible patterns of the first information code correctly and erroneously transmitted in the range of a Hamming distance less than p;

(E) performing an XOR calculation with the first received information code and the plurality of XOR mask vectors and obtaining a plurality of k-bit second information codes;

(F) encoding the plurality of second information codes and obtaining a plurality of second block codes; and (G) performing a correlation calculation with the first received code and the plurality of second block codes.

2. The block code decoding method according to claim 1 further comprising a step of (H) taking a specific one of the plurality of second block codes having a maximum correlation calculation result as a solution.

3. The block code decoding method according to claim 1, wherein the plurality of XOR mask vectors represent all erroneous types of the transmitted first information code, each the value of i represents a corresponding bit of the first information code being erroneously transmitted, each the value of j represents a corresponding bit of the first information code being correctly transmitted, and the XOR calculation binarily exchanges a component of the first received information code corresponding to the component having the value of i in each the permuted mask vector, and keeps a component of the first received information code corresponding to the component having the value of j in each the permuted mask vector unchanged.

4. The block code decoding method according to claim 3, wherein the value of i is 1, the value of j is 0, and the XOR calculation binarily exchanges "0" and "1" by "1" and "0".

5. The block code decoding method according to claim 1, wherein the equation $1+C_1^k+\ldots+C_p^k$ represents both a total number of the plurality of XOR mask vectors and a total number of the plurality of second block codes, wherein the value 1 represents a condition in which no bits are erroneously transmitted during a channel transmission procedure, wherein $C_1^n$ represents a condition in which only 1 bit is erroneously transmitted during the channel transmission procedure, and $C_p^n$ represents a condition in which p bits are erroneously transmitted during the channel transmission procedure.

6. A block code decoding method, comprising the steps of
(A) receiving a first block code being a first received code;
(B) establishing a plurality of XOR mask vectors based on a dimension of k being the length of a first information code and a selected Hamming distance of p, wherein each of the plurality of the XOR mask vectors has a dimension of k, each component of the respective XOR mask vectors comprises a binary value of one of i and j, the plurality of XOR mask vectors is a combination of permuted mask vectors each having k components, wherein between 0 and p components in each mask vector have a value of i and a remaining components therein having the value of j, wherein each of i and j are binary values, each the permuted mask vector corresponds to a permutation of the k components, and wherein the plurality of XOR mask vectors corresponds to all possible patterns of the first information code correctly and erroneously transmitted in the range of a Hamming distance less than p;
(C) performing an XOR calculation with the first received code and the plurality of the XOR mask vectors and obtaining a plurality of k-bit second received codes; and
(D) performing a correlation calculation with the first received code and the plurality of the second received codes.

7. The block code decoding method according to claim 6, further comprising:
(E) taking a specific one of plurality of the second received block codes having a maximum correlation calculation value as a most probable solution.

8. The block code decoding method according to claim 6, wherein the plurality of XOR mask vectors represent all probable erroneous types of errors of the transmitted first block code, each the value of i represents a corresponding bit in the transmitted first block code probably being erroneously transmitted, each the value of j represents a corresponding bit in the transmitted first block code probably being correctly transmitted, and the XOR calculation is a binarily exchanges calculation binary exchanging a component in the first received code corresponding to the component having the value of i in each the plurality of XOR mask vectors, and keeps a component of the first received code corresponding to the component having the value of j in each the plurality of XOR mask vectors unchanged.

9. The block code decoding method according to claim 8, wherein the value of i is 1, and the value of j is 0, and the XOR exchanging calculation therein exchanges "0" and "1" by "1" and "0" respectively.

10. The block code decoding method according to claim 6, wherein both the plurality of XOR mask vectors and the plurality of second received codes have a total number represented by the equation $1+C_1^k+\ldots+C_p^k$, wherein the value 1 represents a condition in which no bits are erroneously transmitted during a channel transmission procedure, wherein $C_1^k$ represents a condition in which only 1 bit is erroneously transmitted during the channel transmission procedure, and $C_p^k$ represents a condition in which p bits are erroneously transmitted during the channel transmission procedure.

11. A decoding method for a received code, comprising an information code and a checking code, the decoding method comprising the steps of:
generating x k-bit calculation masks based on a dimension k equal to the length of the first information code and a selected Hamming distance of p; and
generating x k-bit information comparing codes based on the x calculation masks, wherein the x calculation masks correspond to all possible patterns of the first information code correctly and erroneously transmitted in the range of a Hamming distance less than p;
generating x comparing codes by encoding the x information comparing codes and generating the x comparing codes;
performing a correlation calculation with the received code and the x comparing codes and obtaining x calculation results; and
determining one of the x comparing codes as the most probable solution of the received code based on the x calculation results.

12. The decoding method according to claim 11, wherein the received code is a systematic code, the checking code is a parity check code, and the total number of the erroneous bits is not larger than the value of the length of the information code.

13. The decoding method according to claim 11, wherein the total number of the erroneous bits is p, and x equals to a summation of $1+C_1^k+\ldots+C_p^k$, wherein the value 1 represents a condition in which no bits are erroneously transmitted during a channel transmission procedure, wherein $C_1^k$ represents a condition in which only 1 bit is erroneously transmitted during the channel transmission procedure, and $C_p^k$ represents a condition in which p bits are erroneously transmitted during the channel transmission procedure.

14. The decoding method according to claim 11, wherein the x comparing codes have a specific one corresponding to a specific one of the x calculation results having a maximum value and being a solution.

15. The decoding method according to claim 11, wherein the x calculation masks are XOR masks.

* * * * *